United States Patent [19]

Myhre et al.

[11] 3,742,118

[45] June 26, 1973

[54] METHODS AND DEVICES FOR ENCLOSING ELECTRICAL COMPONENTS

[75] Inventors: Kjell E. Myhre, Sierra Madre; A. Michael Harrison, Pacific Palisades, both of Calif.

[73] Assignee: Micron Instruments, Inc., Los Angeles, Calif.

[22] Filed: Sept. 30, 1971

[21] Appl. No.: 185,101

[52] U.S. Cl. .................... 174/52 S, 29/592, 29/619, 174/52 PE, 338/226, 338/273, 338/329

[51] Int. Cl. ............................................ H05k 5/06

[58] Field of Search ....................... 174/52 S, 52 PE; 29/613, 619, 621, 592; 338/226, 234, 237, 256, 257, 264, 267–270, 273, 274, 276, 296, 300, 302, 303, 321, 322, 329, 331

[56] References Cited

UNITED STATES PATENTS

| | | | |
|---|---|---|---|
| 1,715,879 | 6/1929 | Wells | 29/619 X |
| 2,635,162 | 4/1953 | Kohring | 338/237 X |
| 2,660,653 | 11/1953 | Berkelhamer | 29/613 X |
| 2,745,930 | 5/1956 | Reisman | 338/274 X |
| 2,997,979 | 8/1961 | Tassara | 29/621 UX |
| 3,037,266 | 6/1962 | Pfister | 338/273 UX |
| 3,136,972 | 6/1964 | Randolph | 338/273 |
| 3,136,973 | 6/1964 | Randolph | 338/273 |

FOREIGN PATENTS OR APPLICATIONS

| | | | |
|---|---|---|---|
| 1,079,166 | 4/1960 | Germany | 29/619 |
| 1,103,444 | 3/1961 | Germany | 338/273 |

*Primary Examiner*—Laramie E. Askin
*Attorney*—Luc P. Benoit

[57] ABSTRACT

Methods and devices for enclosing electrical components include an electrically insulating enclosure having initially a pair of spaced openings. An electrical component is disposed in this enclosure, with one terminal lead of the electrical component being located at one opening and another terminal lead of the electrical component being located at another opening of the enclosure. The enclosure is provided with a recess at each opening forming indentations in the side of the enclosure at each opening. The one opening of the enclosure is closed with a solder connected to the one terminal lead of the electrical component. The other opening of the enclosure is closed with a solder connected to the other terminal lead of the electrical component. The quantities of solder employed in closing the openings of the enclosure are also utilized to connect external leads to the terminals of the electrical component. To this end, solder is applied at and through each indentation for closing the openings and connecting each terminal lead to an external lead.

15 Claims, 4 Drawing Figures

KJELL E. MYHRE,
A. MICHAEL HARRISON
INVENTORS.

BY [signature]
ATTORNEY.

METHODS AND DEVICES FOR ENCLOSING ELECTRICAL COMPONENTS

BACKGROUND OF THE INVENTION

1. Field of the Invention

The subject invention relates to methods and devices of enclosing electrical components.

2. Description of the Prior Art

There is a frequent need for enclosing electrical components and for providing electrical terminals or leads for them at the same time. Such a need arises, for instance, in the case of components which are to be used in the environment that would attack the components in their unprotected state.

Despite an abundance of prior-art encapsulation techniques, there is still an unsatisfied need for means and methods in which electrical components are conveniently enclosed and provided with terminals or leads at the same time.

SUMMARY OF THE INVENTION

It is an object of the subject invention to provide improved methods of enclosing an electrical device.

It is a further object of the subject invention to provide articles of manufacture comprising an improved enclosed electrical device.

It is a further object of the subject invention to provide an improved article of manufacture for enclosing an electrical device.

These and other objects of the invention will become apparent as this disclosure proceeds.

From one aspect thereof, the subject invention resides in a method of enclosing an electrical device having a pair of terminal leads and connecting these terminal leads to a pair of external leads, characterized by the improvement comprising in combination the steps of providing an electrically insulating enclosure having a pair of spaced openings, said enclosure being provided with a recess at each opening forming indentations in the side of the enclosure at said openings, disposing the electrical device in that enclosure and one of the terminal leads at one of the openings adjacent one of the indentations and the other of the terminal leads at the other of the openings of the enclosure adjacent the other indentation, disposing an end portion of one of the above mentioned external leads at the one opening and the one indentation and disposing an end portion of the other of the above mentioned external leads at the other opening of the enclosure and the other indentation, applying a solder to the enclosure at the one indentation and through the one indentation for closing said one of said openings with a solder interconnecting said one terminal lead and said one external lead, and applying a solder to the enclosure at the other indentation and through the one indentation for closing said other of said openings with a solder interconnecting said other terminal lead and said other external lead.

In accordance with a preferred embodiment of the subject invention, the above mentioned closing of the one opening of the enclosure includes the steps of rendering solderable a first portion of the enclosure at the one opening and said one indentation, and applying a solder through the one indentation to the one terminal lead of the electrical device, to the end portion of the one external lead and to the first solderable portion to close the one opening of the enclosure and interconnect the one terminal lead and the one external lead, and the closing of the other opening includes the steps of rendering solderable a second portion of the enclosure at the other opening and the other indentation, and applying a solder through the other indentation to the other terminal lead of the electrical device and to the second solderable portion to close the other opening and interconnect the other terminal lead and the other external lead.

The mentioned first and second portions of the enclosure may be rendered solderable by metallizing these first and second portions.

In accordance with a further preferred embodiment of the subject invention, the enclosure is, in turn, encapsulated.

The subject invention resides also in an article of manufacture comprising, in combination, an enclosure having a first end with a first indentation in the side of said enclosure, and a second end with a second indentation in the side of said enclosure, an electrical device located in the enclosure and having a first terminal lead located at said first end adjacent said first indentation and a second terminal lead located at said second end adjacent said second indentation, a first external lead, a second external lead, a first quantity of solder closing said first end of the enclosure at said first indentation in the side of said enclosure and interconnecting said first terminal lead and an end of said first external lead, and a second quantity of solder closing said second end of the enclosure at said second indentation in the side of said enclosure and interconnecting said second terminal lead and an end of said second external lead.

BRIEF DESCRIPTION OF THE DRAWINGS

The subject invention will become more readily apparent from the following detailed description of preferred embodiments thereof, illustrated by way of example in the accompanying drawings, in which.

Like reference numerals in the drawings designate like or functionally equivalent parts.

DESCRIPTION OF PREFERRED EMBODIMENTS

Figure 1:
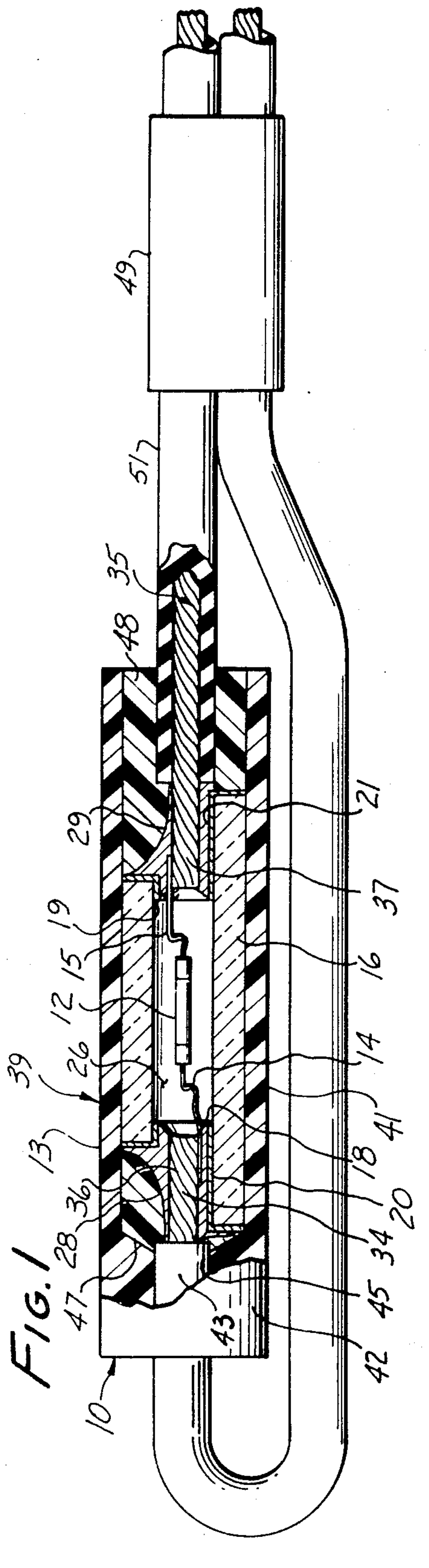
FIG. 1 is a side view, partially in section, of an electrical device enclosure in accordance with a preferred embodiment of the subject invention.

The enclosed electrical device 10 of FIG. 1 comprises an electrical device 12 and an enclosure 13 therefor. Examples of the electrical device 12 include temperature-sensitive resistors if the device 10 is a temperature sensor, for instance, or other electrical circuit components that are to be protected from the environment.

The electrical device 12 includes a pair of terminals 14 and 15. In the illustrated preferred embodiment of FIG. 1, the terminals 14 and 15 have, by way of example, the form of terminal leads.

Figure 3:
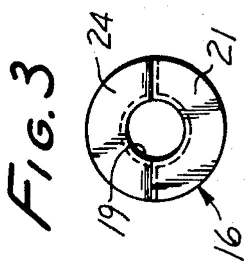
FIG. 3 is another side view of the enclosure element of FIG. 2, as seen in the direction of the arrow 3 in FIG. 2.
Figure 2:
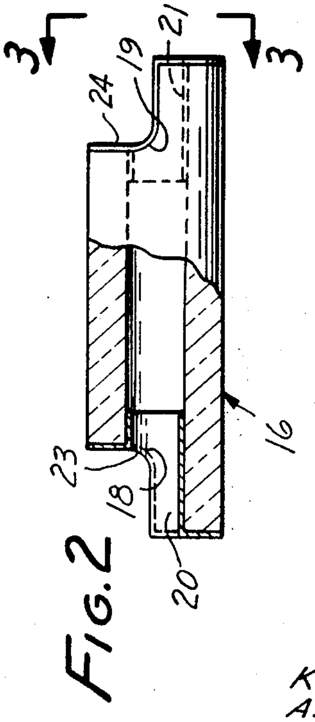
FIG. 2 is a side view, partially in section, of an enclosure element used in the enclosure of FIG. 1 and structured in accordance with a preferred embodiment of the subject invention.

The enclosure 13 includes a tubular enclosure or envelope element 16. As seen in FIGS. 2 and 3, the enclosure element 16 initially has a pair of spaced openings 18 and 19.

The enclosure element 16 further has a first solderable end portion 20 at the opening 18 and a second solderable end portion 21 at the opening 19. The solderable portions 20 and 21 are sufficiently spaced from one another to prevent short-circuiting or shunting of the electrical device 12. The solderable end portions 20 and 21 have recesses 23 and 24 to facilitate the application of solder to the end portions 20 and 21. As seen in FIGS. 1 to 4 the recesses 23 and 24 form indentations in the side of the enclosure element at the openings 18 and 19.

By way of example, the enclosure element 16 may be made of a ceramic material, such as alumina ($Al_2O_3$), beryllia (BeO), Steatite ($MgO \cdot SiO_2$), or lava, or quartz, or porcelain, for instance. The technique for making the tubular enclosure element 16 may be essentially the same as the prior-art techniques for making tubing or tubular articles of the above-mentioned materials. For instance, a compound of the desired material may be brought into the desired shape and then fired. Alternatively, tubular members of the desired length may be cut from tubing of the particular material.

The end portions 20 and 21 at the openings 18 and 19 of the enclosure element 16 may be rendered solderable by metallizing the portions 20 and 21. By way of example, one or more metals may be deposited on the end portions 20 and 21 by painting and/or plating. For instance, a molybdenum-manganese paste may be painted onto the end portions 20 and 21 and the resulting molybdenum-manganese deposit may be subsequently plated with nickel, gold, tin and the like. Metallizing processes of this type are widely practiced in the ceramic industry.

Figure 4:
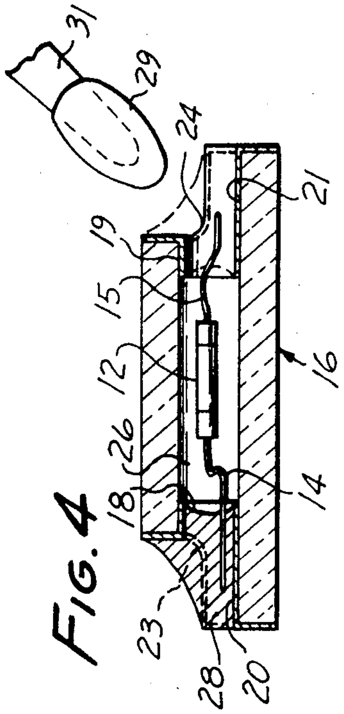
FIG. 4 is a section of an electrical device enclosure in accordance with a further preferred embodiment of the subject invention.

The electrical device 12 is disposed inside the hollow space 26 within the enclosure element 16, with the terminal lead 14 being located at the opening 18 and the terminal lead 15 being located at the opening 19 of the enclosure 16. As best seen in FIG. 4, a first quantity of solder 28 is applied to the solderable portion 20 of the enclosure element 16 at the opening 18 and to the terminal lead 14 of the electrical device 12. Similarly, a second quantity of solder 29 is applied to the solderable portion 21 of the enclosure element 16 at the opening 19 and to the terminal lead 15 of the electrical device 12. FIG. 4 shows part of a soldering iron 31 for applying the quantities of solder 28 and 29 to the solderable portions 20 and 21 and to the terminal leads 14 and 15.

By way of example, suitable solders for the practice of the subject invention include tin-lead, bismuth-base, indium-base, tin-silver, tin-zinc, lead-silver, cadmium-zinc, zinc-aluminum, and cadmium-silver alloys.

Sufficient amounts of solder are employed to close the openings 18 and 19 with quantities of solder 28 and 29 connected to the terminal leads 14 and 15 of the electrical device 12.

The electrical device enclosed in accordance with FIG. 4 has utility of its own, quite apart from the preferred embodiment shown in FIG. 1. For instance, the enclosed device may be distributed or sold for subsequent encapsulation by the customer. Leads may be subsequently attached to the solder quantities 28 and 29 or spring clips or other contact devices (not shown) may be employed to connect the enclosed component 12 to an external electrical circuit (not shown). In practice, the heat of the soldering process will automatically drive some of the air or other gases out of the hollow space 26 inside the enclosure element 16 so that the inside of the enclosure element is in a partially evacuated or rarified state after termination of the soldering process and cooling of the enclosure element 16 and solder quantities 28 and 29. This, for instance, reduces oxidation of the electrical device 12 inside the enclosure element 16. It should particularly be noted that the practice of the subject invention provides a hermetic enclosure for the device 12 of high integrity with a minimum of effort and at low cost. Apertures or pores may, of course, be provided in the enclosure 16 if a hermetic seal is not desired.

A particularly preferred embodiment of the invention is shown in FIG. 1. The embodiment of FIG. 1 differs from that of FIG. 4 in that the quantities of solder 28 and 29 are employed not only to close the openings 18 and 19 of the enclosure element 16, but also to connect external leads 34 and 35 to the terminals or terminal leads 14 and 15, respectively, of the electrical device 12.

The closing of the openings 18 and 19 of the enclosure 16 in the embodiment of FIG. 1 proceeds generally in the manner illustrated in FIG. 4, except that an exposed end portion 36 of the lead 34 is disposed at the opening 18, and an exposed portion 37 of the lead 35 is disposed at the opening 19 prior to application of the quantities of solder 28 and 29. The opening 18 is then closed with the quantity of solder 28 which when solidified adheres to the solderable end portion 20 and interconnects the terminal lead 14 and the lead 34. Similarly, the opening 19 is closed with the quantity of solder 29 which when solidified adheres to the solderable portion 21 and interconnects the terminal lead 15 and the lead 35.

The structure of FIG. 1 so far described has utility of its own in that it may be distributed or sold for subsequent encapsulation by the customer. In accordance with a further preferred embodiment of the subject invention, however, the enclosed device is encapsulated or provided with an encapsulation 39.

The encapsulation 39 comprises a tubular housing 41 for receiving the enclosure element 16 and portions of the leads 34 and 35. The housing 41 has a bottom portion 42 enclosing the insulation 43 of the lead 34 adjacent the soldered end portion 36. To this end, the housing 41 has a bore 45 through its bottom portion 42 for snuggly receiving the insulation 43 of the lead 34. The housing 41 is preferably cast or molded from a suitable compound or machined out of a rod of a suitable material. Suitable compounds or materials include low-moisture absorbing, electrically insulating resins, such as epoxy resins, polycarbonates, polyester resins, acrylics, polyimides and the like.

The encapsulation process may be initiated by threading part of the lead 34 through the bore 45. The soldered enclosure element 16 may then be advanced towards the tubular housing 41 by pulling on the lead 34. Before the enclosure element is pulled into the housing, a quantity of a sealant 47 is placed inside the housing 41. The insertion of the enclosure element 16 into the tubular housing 41 is then effected whereby the sealing compound 47 will assume the position shown in FIG. 1. A further quantity 48 of that sealing compound is then introduced into the housing 41 to complete the sealing of that housing. The result is a fully encapsulated unit. If desired, a band or tube 49 of electrically insulating material may be placed about the leads 34 and 35 to improve the integrity and ruggedness of the encapsulated unit. The same resins may be used for the sealing compounds at 47 and 48 as for the housing 41.

The leads 34 and 35 are provided with an insulation that is compatible with the intended use of the electrical device. For instance, if the electrical device 12 is intended to be used as a temperature sensor, then the leads 34 and 35 are preferably provided with a high-temperature insulation 43 and 51 which may, for instance, be made of an inert, tough, insoluble polymer, such as Teflon (polytetrafluoroethylene) or polyvinylchloride.

The unit of FIG. 1 is not only characterized by a considerable ease of manufacture and assembly, but is also very rugged and reliable in practice.

It will be appreciated that the enclosure element 16 of FIGS. 2 and 3 has utility of its own in that it can be distributed or sold to customers who wish to effect their own assembly and encapsulation of electrical devices.

Variations and modifications within the spirit and scope of the subject invention will become apparent or suggest themselves to those skilled in the art.

We claim:

1. In a method of enclosing an electrical device having a pair of terminal leads and connecting said terminal leads to a pair of external leads, the improvement comprising in combination the steps of:

providing an electrically insulating enclosure having a pair of spaced openings, said enclosure being provided with a recess forming an indentation at each opening;

disposing said electrical device in said enclosure and one of said terminal leads at one of said openings adjacent one of said indentations and the other of said terminal leads at the other of said openings adjacent the other of said indentations;

disposing an end portion of one of said external leads at said one opening and said one indentation, and disposing an end portion of the other of said external leads at said other opening and said other indentation;

applying a solder to said enclosure at said one indentation and through said one indentation for closing said one of said openings with solder interconnecting said one terminal lead and said one external lead; and applying a solder to said enclosure at said other indentation and through said other indentation for closing said other of said openings with solder interconnecting said other terminal lead and said other external lead.

2. A method as claimed in claim 1, wherein:

said closing of said one opening includes the steps of rendering solderable a first portion of said enclosure at said one opening and said one indentation, and applying a solder through said one indentation to said one terminal lead, to said end portion of said one external lead and to said first solderable portion to close said one opening and interconnect said one terminal lead and said one external lead; and said closing of said other opening includes the steps of rendering solderable a second portion of said enclosure at said other opening and said other indentation, and applying a solder through said other indentation to said other terminal lead, to said end portion of said other external lead and to said second solderable portion to close said other opening and interconnect said other terminal lead and said other external lead.

3. A method as claimed in claim 2, wherein:

said first and second portions are rendered solderable by metallizing said first and second portions of said enclosure.

4. A method as claimed in claim 2, wherein:

said enclosure is made of a ceramic material which is rendered solderable by metallizing said first and second portions of said enclosure.

5. A method as claimed in claim 2, including the step of encapsulating said enclosure, said applied solder and said end portions of said external leads.

6. A method as claimed in claim 1, including the step of encapsulating said enclosure, said solder and said end portions of said external leads.

7. An article of manufacture comprising in combination:

an enclosure having a first end with a first indentation in the side of said enclosure, and a second end with a second indentation in the side of said enclosure;

an electrical device located in said enclosure and having a first terminal lead located at said first end adjacent said first indentation, and a second terminal lead located at said second end adjacent said second indentation;

a first external lead;

a second external lead;

a first quantity of solder closing said first end of the enclosure at said first indentation in the side of said enclosure and interconnecting said first terminal lead and an end of said first external lead; and a second quantity of solder closing said second end of the enclosure at said second indentation in the side of said enclosure and interconnecting said second terminal lead and an end of said second external lead.

8. An article of manufacture as claimed in claim 7, wherein:

said enclosure is metallized at said first end and is metallized at said second end.

9. An article of manufacture as claimed in claim 7, wherein:

said enclosure is made of a ceramic material.

10. An article of manufacture as claimed in claim 7, wherein:

said enclosure is tubular.

11. An article of manufacture as claimed in claim 10, wherein:

said enclosure is made of electrically insulating material.

12. An article of manufacture as claimed in claim 11, wherein:

said enclosure is metallized at said first end and is metallized at said second end.

13. An article of manufacture as claimed in claim 7, including:

an encapsulation for said enclosure.

14. An article of manufacture as claimed in claim 7, including:

an encapsulation for said enclosure, said first and second quantities of solder, and said ends of said first and second external leads.

15. An article of manufacture as claimed in claim 14, wherein:

said encapsulation includes a housing for said enclosure, said housing having a bottom portion enclosing said end of said first external lead, and a quantity of material closing said housing at said end of said second external lead.

* * * * *

UNITED STATES PATENT OFFICE
CERTIFICATE OF CORRECTION

PATENT NO. : 3,742,118

DATED : June 26, 1973

INVENTOR(S) : Kjell E. Myhre and Michael Harrison

It is certified that error appears in the above-identified patent and that said Letters Patent are hereby corrected as shown below:

Column 1, line 13, "the", first occurrence, should be --an--. Column 5, lines 34 and 35 should read --vided with a recess at each opening forming indentations in the side of the enclosure at said openings--.

Signed and Sealed this

*twentieth* Day of *April 1976*

[SEAL]

*Attest:*

RUTH C. MASON
*Attesting Officer*

C. MARSHALL DANN
*Commissioner of Patents and Trademarks*